United States Patent
Gostovic et al.

(10) Patent No.: US 9,090,461 B2
(45) Date of Patent: Jul. 28, 2015

(54) TEMPORARY OPTICAL WAVE DIFFUSION-PROMOTING FILM ADHERED TO LIDDED MEMS WAFER FOR TESTING USING INTERFEROMETER

(71) Applicant: Hewlett-Packard Development Company, L.P., Houston, TX (US)

(72) Inventors: Danijel Gostovic, Corvallis, OR (US); James E. Ellenson, Corvallis, OR (US); Tracy B. Forrest, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/874,262

(22) Filed: Apr. 30, 2013

(65) Prior Publication Data
US 2014/0320847 A1    Oct. 30, 2014

(51) Int. Cl.
*B81C 99/00* (2010.01)

(52) U.S. Cl.
CPC .................................. *B81C 99/004* (2013.01)

(58) Field of Classification Search
CPC ................. G01N 1/2813; G01N 1/286; G01N 2001/284; G01N 21/6428; G02B 21/32
USPC .................................................. 356/36, 244
See application file for complete search history.

(56) References Cited

U.S. PATENT DOCUMENTS

| | | | |
|---|---|---|---|
| 4,565,093 A | 1/1986 | Jurva et al. | |
| 6,235,387 B1 * | 5/2001 | Bennett et al. | 428/355 AC |
| 7,852,435 B2 * | 12/2010 | Fujisawa et al. | 349/95 |
| 7,888,793 B2 | 2/2011 | Sherrer et al. | |
| 2007/0273867 A1 * | 11/2007 | Diessel et al. | 356/36 |
| 2008/0308922 A1 | 12/2008 | Zhang et al. | |
| 2010/0154517 A1 | 6/2010 | Sammoura | |

OTHER PUBLICATIONS

"Tape for semiconductor wafer dicing & hybrid substrate sawing" brochure, Semiconductor Equipment Corp., year 2004.
"Semiconductor Equipment Corporation Dicing Tape" sheet, Semiconductor Equipment Corp., Oct. 2004.
M. Antelius, "Wafer-scale vacuum and liquid packaging concepts for an optical thin-fiml gas sensor," Doctoral Thesis, KTH Electrical Engineering, Stockholm, Sweden, year 2013.

* cited by examiner

*Primary Examiner* — Tarifur Chowdhury
*Assistant Examiner* — Mohamed Amara
(74) *Attorney, Agent, or Firm* — Michael A. Dryja

(57) ABSTRACT

A temporary optical wave diffusion-promoting film is adhered to a lidded microelectromechanical systems (MEMS) wafer. Testing is performed on the lidded MEMS wafer using an interferometer directed towards the temporary optical wave diffusion-promoting film applied to the lidded MEMS wafer. The temporary optical wave diffusion-promoting film is peeled from the lidded MEMS wafer to remove the temporary optical wave diffusion-promoting film from the lidded MEMS wafer after performing the testing.

20 Claims, 3 Drawing Sheets

TEMPORARY OPTICAL WAVE DIFFUSION-PROMOTING FILM ADHERED TO LIDDED MEMS WAFER FOR TESTING USING INTERFEROMETER

BACKGROUND

Microelectromechanical systems (MEMS) devices are generally very small mechanical devices driven by electricity. MEMS devices can also be referred to as micromachines and micro systems technology (MST) devices. MEMS devices can be fabricated on wafers, such as silicon wafers. Some types of MEMS devices include lids thereover that protect the sensitive MEMS components. These lids may also be referred to as membranes.

DETAILED DESCRIPTION

As noted in the background section, some types of microelectromechanical systems (MEMS) devices include lids to protect their sensitive MEMS components. The lids may have to be hermetically sealed to ensure that the MEMS components are not exposed to the environment in which the MEMS devices are used. Therefore, during fabrication of such MEMS devices, the hermiticity of the lid of such a lidded MEMS wafer is tested.

One way in which hermiticity testing can be performed is to use an interferometer. A laser or other optical wave is directed towards the lid at an oblique angle. The lid is transparent, and the wafer underlying the lid diffuses, or scatters, the reflected optical wave. A detector is employed to detect the diffused optical wave as reflected. Based on characteristics of the detected optical wave, the hermiticity of the lidded MEMS wafer can be determined.

This approach works well for wafers, like silicon wafers, that are polished on just one side, and which are referred to as single-side polished (SSP) wafers. The side of an SSP wafer on which the lid is disposed is the non-polished, rough side. This roughness ensures that an optical wave directed towards the lid is diffused or scattered when reflected by the wafer underlying the lid.

This approach does not work well for silicon and other wafers that are polished on both sides, and which are referred to as double-side polished (DSP) wafers. The side of a DSP wafer on which the lid is disposed is also polished. The lack of roughness means that an optical wave directed towards the lid is not diffused or scattered when reflected by the wafer. Because the reflected wave in this case is not diffused or scattered, a complete determination of the hermiticity of the lid over the MEMS components cannot be achieved.

Disclosed herein are techniques to permit such hermiticity and other types of testing that rely upon a reflected optical wave being diffused or scattered even for DSP wafers. A temporary optical wave diffusion-promoting film is applied to a semiconductor wafer, like a silicon or other wafer having lidded MEMS components thereon. The film reflectively diffuses the optical wave so that testing that relies upon a reflected optical wave being diffused or scattered can be performed. After testing, the film is removed from the wafer.

Figure 1:
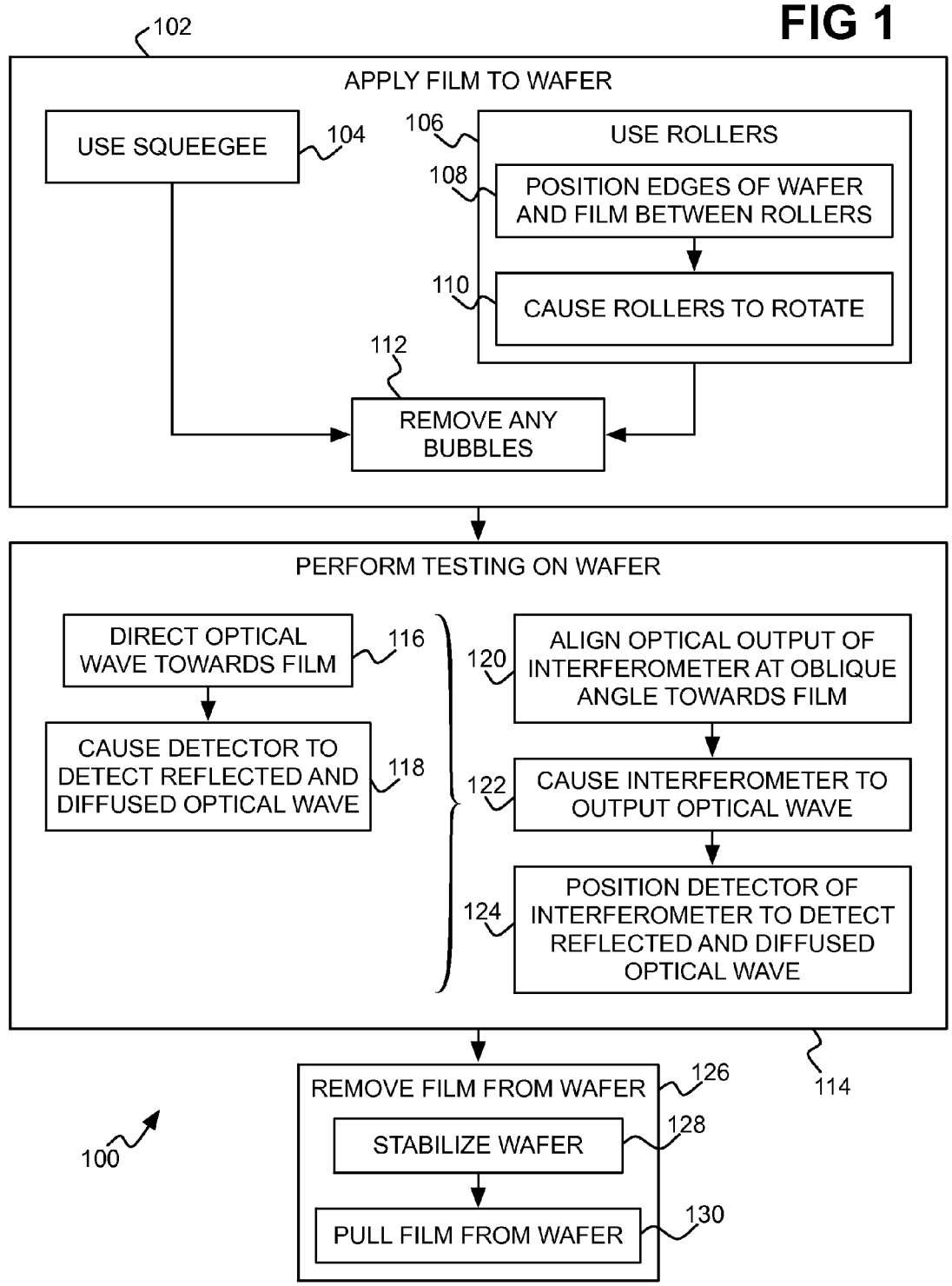
FIG. 1 is a flowchart of an example method in which a film is temporarily applied to a wafer for wafer-testing purposes.

FIG. 1 shows an example method 100 in accordance with such techniques. The method 100 is typically performed within a clean room environment by a technician or other clean room personnel. A film is applied to a wafer (102). More specifically, a temporary optical wave diffusion-promoting film is adhered to a lidded MEMS wafer.

The film can have the following characteristics. A first characteristic is a no-adhesive transfer physical property. This ensures that subsequent removal of the film, after testing has been performed on the wafer, does not leave any adhesive or other residue. The wafer remains as pristine after testing as it was before testing.

A second characteristic is an optical property of inducing diffusion of waves output towards the film. Such waves can include optical waves like laser beams. The waves may be output by an interferometer. Being able to diffuse the optical or other waves ensures that proper testing, such as hermiticity testing, can be achieved even when the wafer is a DSP wafer.

A third characteristic is that the film has been approved for usage within a clean room. Many manufacturers of MEMS and other types of devices, to ensure the sanctity of their clean rooms, may not permit unapproved supplies to be introduced. A film that has already been approved for usage within a clean room ensures that the techniques disclosed herein can be readily employed.

One type of a temporary optical wave diffusion-promoting film that can be adhered to a lidded MEMS wafer and has these characteristics is semiconductor dicing tape designed for semiconductor wafer and ceramic hybrid substrate sawing. An example of such a film is known as blue medium tack tape. Such blue medium tack tape is available, for instance, from Semiconductor Equipment Corporation, of Moorpark Calif., under the part number 18074 or 18619.

Usage of such blue medium tack tape in accordance with the techniques disclosed herein is particularly novel, because such usage employs the tape for an unintended purpose other than that for which the tape has been designed. Blue medium tack tape has been designed to be adhered to wafers so that the wafers can be properly sawed, or diced. Blue medium tack tape is known to have been used for other purposes, such as surface protection and the removal of contaminant particles from wafers, but not for its discovered optical wave diffusion-promoting characteristics, as disclosed and leveraged herein.

In some implementations, the film can be applied to wafer by using a squeegee (104) or by using parallel rollers (106). Desirably, the film is adhered to the wafer without introducing any air bubbles—i.e., gaseous bubble artifacts—between the film and the wafer surface, which can affect hermiticity testing reliability in particular. Therefore, after the film has been adhered to the wafer, any bubbles are removed (112), such as by using a squeegee.

Figure 2:
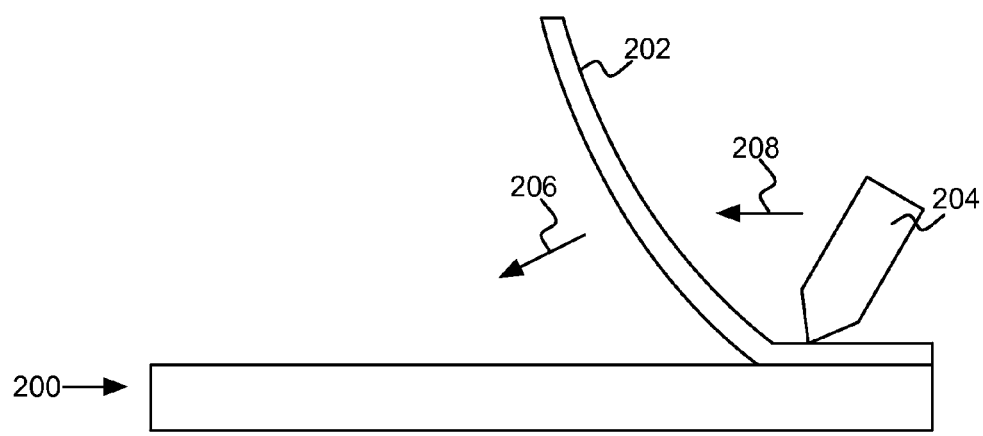
FIG. 2 is a diagram illustratively depicting example usage of a squeegee to temporarily apply a film to a wafer.

FIG. 2 illustratively depicts an example of how a squeegee 204 can be used to apply a temporary optical wave diffusion-promoting film 202 to a lidded MEMS wafer 200. As the film 202 is placed on the surface of the wafer 200, as indicated by the arrow 206, a squeegee is moved against the film 202, as indicated by the arrow 208, to decrease the potential for air bubbles forming between the film 202 and the wafer 200. As such, the film 202 is applied to the wafer 200 starting with one edge of the film 202, and proceeding through to the opposite edge of the film 202. If any air bubbles are introduced, the squeegee 204 may be moved back and forth against the film 202 to push the bubbles out at the edges of the film 202.

Referring back to FIG. 1, a pair of parallel rollers can be used to apply the film to the wafer as follows (106). Leading edges of the wafer and the film are positioned at an inlet between the rollers (108). The rollers are caused to rotate in opposite directions (e.g., clockwise and counter-clockwise) to feed the wafer and the film between and through the rollers (110). While the rollers are rotating, the film that has not yet traveled between or through the rollers is positioned or held away from the wafer. Using rollers as opposed to a squeegee can be desirable because this technique ensures that an even pressure is applied to the wafer and the film against one another.

Figure 3:
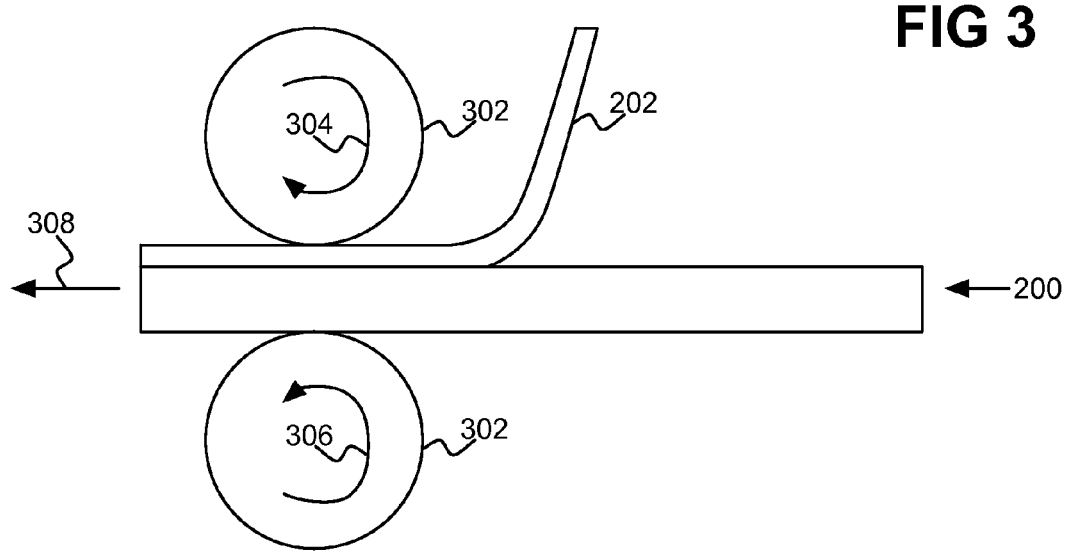
FIG. 3 is a diagram illustratively depicting example usage of rollers to temporarily apply a film to a wafer.

FIG. 3 illustratively depicts an example of how parallel rollers 302 can be used to apply the temporary optical wave diffusion-promoting film 202 to the lidded MEMS wafer 200. The film 202 is held away from the wafer 200, except at leading edges of the film 202 and the wafer 200 at which the film 202 and the wafer 200 are inserted between the rollers 302, which is the inlet of the rollers 302. The rollers 302 are rotated in opposite directions, as indicated by the arrows 304 and 306. This rotation causes the film 202 and the wafer 200 to advance through the rollers 302, as indicated by the arrow 308. The rollers 302 can be flexible and soft, and impart an even pressure against the film 202 and the wafer 200 to cause the film 202 to adhere to the wafer 200.

Referring back to FIG. 1, once the film has been adhered to the wafer, testing is performed on the wafer (114). Such testing can be performed using an interferometer, and such testing can be hermiticity testing, to verify the hermiticity of the lid over the MEMS components on the silicon or other wafer. For instance, in general, an optical wave is directed towards the film (116), and a detector is caused to detect the optical wave as reflected and diffused by the film (118).

More specifically, for instance, the optical output of an interferometer may be aligned at an oblique angle to and towards the film (120). The interferometer is then caused to output an optical wave, such as a laser, at an oblique angle towards the film (122). This results in the film reflectively diffusing the optical wave. A detector of the interferometer is positioned to detect the optical wave as reflectively diffused by the film (124). The detected optical wave can be used to satisfactorily assess the hermiticity or other aspect of the wafer under consideration, even if the wafer is a DPS wafer, due to the film on the wafer appropriately diffusing or scattering the optical wave.

Figure 4:
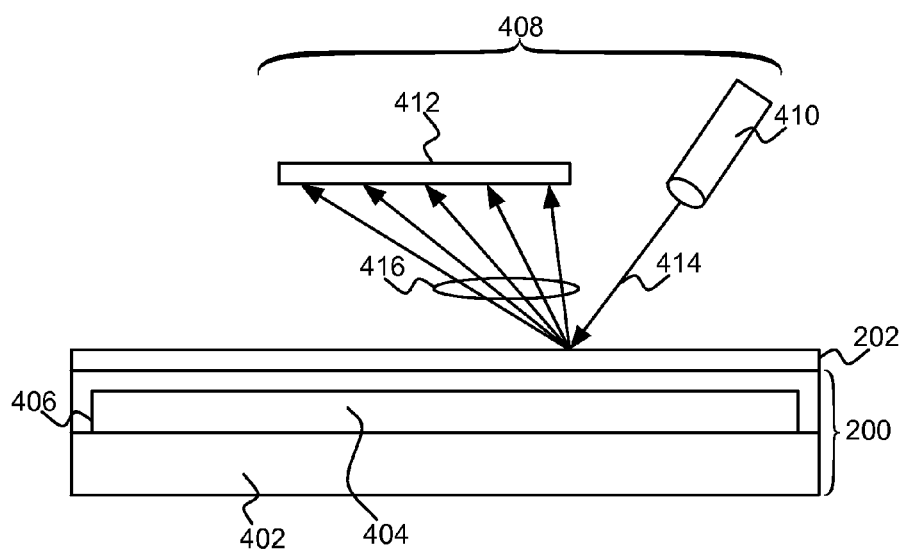
FIG. 4 is a diagram illustratively depicting example testing of a wafer on which a film has been temporarily applied.

FIG. 4 illustratively depicts an example of how the lidded MEMS wafer 200 having the temporary optical wave diffusion-promoting film 202 adhered thereto can be tested using an interferometer 408. The lidded MEMS wafer 200 is more explicitly shown in FIG. 4 as including a silicon or other substrate 402, MEMS components or devices 404 on or in the substrate 402, and a membrane or lid 406 that desirably hermetically seals the MEMS devices 404. The lid 406 may be titanium oxide.

An optical output of an optical wave generator 410 of the interferometer 408 is aligned at an oblique angle to the film 202. The generator 410 generates an optical wave 414, such as a laser, at this oblique angle, which the film 202 diffuses and reflects as the reflectively diffused optical wave 416. A detector 412 of the interferometer 408 is positioned to detect the reflectively diffused optical wave 416. On the basis of this detected optical wave 416, the interferometer 408 can help determine, for instance, whether the lid 406 satisfactorily hermetically seals the MEMS devices 404 disposed on the substrate 402.

If the film 202 were not present on the wafer 202, and if the wafer 202 were a DSP wafer, the testing depicted in FIG. 4 could not sufficiently determine whether the lid 406 satisfactorily hermetically seals the MEMS devices 404 disposed on the substrate 402. This is because the reflected optical wave 416 would not be diffused or scattered, but rather would be nearly as directed and non-diffuse as the optical wave 414 output by the generator 410. As such, the detector 412 would insufficiently detect the reflected optical wave 416 for adequate hermiticity testing to be performed.

Referring back to FIG. 1, once testing has been performed on the wafer, the film can be removed from the wafer (126) by, for instance, peeling the film from the wafer. Because the film does not leave any residue on the wafer, removal of the film results in the wafer being as free of contaminants as it was prior to temporarily film application. In one implementation, film removal can be performed by stabilizing the wafer at one end thereof (128), such as by personnel holding the wafer against a table, and the film pulled from the wafer beginning at an opposite edge of the film and parallel to the surface of the wafer (130).

Figure 5:
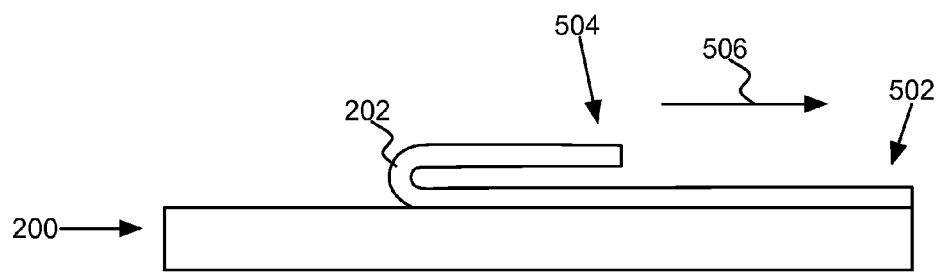
FIG. 5 is a diagram illustratively depicting example removal of a film temporarily applied to a wafer.

FIG. 5 illustratively depicts an example of how the temporary optical wave diffusion-promoting film 202 can be removed from the lidded MEMS wafer 200. The wafer 200 is stabilized towards an edge 502 thereof. The film 202 is pulled parallel to the surface of the wafer 200 beginning at an opposite edge 504 thereof, as indicated by the arrow 506. Pulling the film 202 parallel to the surface of the wafer 202 in this manner helps prevent placing undue stress on the wafer 202 that otherwise could possibly undesirably cause the wafer 202 to bow.

The techniques disclosed herein advantageously employ a film so that even DSP wafers can be tested on the basis of detected reflectively diffused optical waves. These techniques are advantageous as compared to a myriad and multitude of other techniques that could instead be employed. Other, less desirable techniques that have been considered include coating the DSP wafer in a different way. For example, polymerized titanium oxide could be coated onto the wafer, and would peel off cleanly after testing. However, this type of coating is not clean room approved, and is of questionable fabrication compatibility.

As another example of a technique that has been considered, a magnaflux die-penetrant developer could be coated onto the wafer. This approach involves spraying talcum powder onto the wafer, which adheres with electrostatic force, and then wiping the powder from the wafer with water or alcohol after testing. However, this type of coating would result in contaminant particles remaining on the wafer, and is thus incompatible with fabrication techniques.

As a final example of a technique that has been considered, a lidded wafer may have its lid machined with a laser down to but not including the silicon or other substrate of the wafer, or may have its lid machined with etchant down to and partially including the substrate. Such machining roughens the surface of the wafer so that the surface will reflectively diffuse an incident optical wave. However, this type of machining is destructive in nature, is non-reversible, and defeats any advantage ascribable to using a wafer that is DSP.

The techniques disclosed herein, by comparison, have been invented after such other and less desirable techniques were determined and dismissed as disadvantageous. The techniques disclosed herein are particularly inexpensive, fast, easily employed, and can use films that are already approved for clean rooms. Semiconductor dicing tape is typically plentifully available in clean rooms for sawing and other purposes. The techniques disclosed herein leverage such readily available "blue tape" for the novel and heretofore-unused usage of preparing wafers for hermiticity and other types of testing.

We claim:
1. A method comprising:
adhering a temporary optical wave diffusion-promoting film to a lidded microelectromechanical systems (MEMS) wafer;
performing testing on the lidded MEMS wafer using an interferometer directed towards the temporary optical wave diffusion-promoting film applied to the lidded MEMS wafer, the temporary film permitting the testing to be performed on the lidded MEMS wafer using the interferometer, wherein without the temporary film, the testing is unable to be successfully performed; and
peeling the temporary optical wave diffusion-promoting film from the lidded MEMS wafer to remove the temporary optical wave diffusion-promoting film from the lidded MEMS wafer after performing the testing.
2. The method of claim 1, wherein the temporary optical wave diffusion-promoting film is a semiconductor dicing tape designed for semiconductor wafer and ceramic hybrid substrate sawing.
3. The method of claim 2, wherein the semiconductor dicing tape is blue medium tack tape.
4. The method of claim 1, wherein the temporary optical wave diffusion-promoting film has a physical property of no-adhesive transfer.
5. The method of claim 1, wherein the temporary optical wave diffusion-promoting film has an optical property of inducing diffusion of waves output by the interferometer towards the film.
6. The method of claim 1, wherein the temporary optical wave diffusion-promoting film has a characteristic of having been approved for clean room usage.
7. The method of claim 1, wherein adhering the temporary optical wave diffusion-promoting film to the lidded MEMS wafer comprises adhering the temporary optical wave diffusion-promoting film to the lidded MEMS wafer without introducing gaseous bubble artifacts between the temporary optical wave diffusion-promoting film and the lidded MEMS wafer.
8. The method of claim 1, wherein adhering the temporary optical wave diffusion-promoting film to the lidded MEMS wafer comprises:
using a squeegee to apply the temporary optical wave diffusion-promoting film to the lidded MEMS wafer; and
using a squeegee to remove any gaseous bubble artifacts between the temporary optical wave diffusion-promoting film and the lidded MEMS wafer.
9. The method of claim 1, wherein adhering the temporary optical wave diffusion-promoting film to the lidded MEMS wafer comprises using a pair of parallel rollers to apply the temporary optical wave diffusion-promoting film to the lidded MEMS wafer.
10. The method of claim 1, wherein adhering the temporary optical wave diffusion-promoting film to the lidded MEMS wafer comprises:
positioning a leading edge of the lidded MEMS wafer and a leading edge of the temporary optical wave diffusion-promoting film at an inlet between a pair of rollers; and
causing concurrent clockwise rotation of a first roller of the pair and counter-clockwise rotation of a second roller of the pair to feed the lidded MEMS wafer and the temporary optical wave diffusion-promoting film between and through the pair of rollers, while positioning the temporary optical wave diffusion-promoting film that has yet to travel through the pair of rollers away from the lidded MEMS wafer,
wherein the pair of rollers apply even pressure to the lidded MEMS wafer and the temporary optical wave diffusion-promoting film against one another.
11. The method of claim 10, wherein adhering the temporary optical wave diffusion-promoting film to the lidded MEMS wafer further comprises:
removing any gaseous bubble artifacts between the temporary optical wave diffusion-promoting film and the lidded MEMS wafer.
12. The method of claim 1, wherein performing the testing on the lidded MEMS wafer using the interferometer comprises performing hermiticity testing on the lidded MEMS wafer using the interferometer.
13. The method of claim 1, wherein performing the testing on the lidded MEMS wafer using the interferometer comprises:
aligning an optical output of the interferometer at an oblique angle towards the temporary optical wave diffusion-promoting film;
causing the interferometer to output an optical wave at the oblique angle towards the temporary optical wave diffusion-promoting film, resulting in the temporary optical wave diffusion-promoting film reflectively diffusing the optical wave; and
positioning a detector of the interferometer to detect the optical wave as reflectively diffused by the temporary optical wave diffusion-promoting film.
14. The method of claim 1, wherein peeling the temporary optical wave diffusion-promoting film from the lidded MEMS wafer comprises:
stabilizing the lidded MEMS wafer towards an end thereof; and
pulling the temporary optical wave diffusion-promoting film from the lidded MEMS wafer beginning at an edge of the temporary optical wave diffusion-promoting film opposite the end of the lidded MEMS wafer and parallel to a surface of the lidded MEMS wafer.
15. A method comprising:
applying a temporary optical wave diffusion-promoting film to a semiconductor wafer to permit testing of the semiconductor wafer using an optical wave, wherein without the film the semiconductor wafer is unable to be successfully tested using the optical wafer;
performing the testing on the semiconductor wafer by directing the optical wave towards the film applied to the semiconductor wafer, the film reflectively diffusing the optical wave; and
removing the film from the semiconductor wafer after performing the testing.
16. The method of claim 15, wherein:
the film is semiconductor dicing tape;
the film has a physical property of inhibited adhesive transfer;
the film is approved for clean room usage.
17. The method of claim 15, wherein applying the film to the semiconductor wafer comprises applying the film to the semiconductor wafer without introducing gaseous bubbles between the film and the semiconductor wafer.
18. The method of claim 15, wherein applying the film to the semiconductor wafer comprises one or more of:
using a squeegee; and
using a pair of rollers.

19. The method of claim 15, wherein applying the film to the semiconductor wafer comprises removing any gaseous bubbles introduced between the film and the semiconductor wafer.

20. The method of claim 15, wherein performing the testing on the semiconductor wafer comprises, after directing the optical wave towards the film, causing a detector to detect the optical wave as reflectively diffused by the film.

* * * * *